(12) United States Patent
Richter (10) Patent No.: US 8,460,751 B2
(45) Date of Patent: Jun. 11, 2013

(54) METHOD FOR THE SYNTHESIS OF METALLIC NANOTUBES AND NANOTUBES SYNTHESIZED BY THE METHOD

(75) Inventor: Gunther Richter, Leinfelden-Echterdingen (DE)

(73) Assignee: Max-Planck-Gesellschaft zur Foerderung der Wissenschaften E.V., Munich (DE)

( * ) Notice: Subject to any disclaimer, the term of this patent is extended or adjusted under 35 U.S.C. 154(b) by 190 days.

(21) Appl. No.: 12/862,496

(22) Filed: Aug. 24, 2010

(65) Prior Publication Data

US 2011/0076509 A1 Mar. 31, 2011

Related U.S. Application Data

(60) Provisional application No. 61/238,022, filed on Aug. 28, 2009.

(51) Int. Cl.
*C23C 16/00* (2006.01)
*B05D 3/00* (2006.01)

(52) U.S. Cl.
USPC ......... 427/250; 427/249.1; 977/810; 977/811

(58) Field of Classification Search
None
See application file for complete search history.

(56) References Cited

U.S. PATENT DOCUMENTS

2004/0175844 A1* 9/2004 Yang et al. ............... 438/2
2005/0229744 A1 10/2005 Kijima

FOREIGN PATENT DOCUMENTS

WO    WO 2007/100811 A2    9/2007

OTHER PUBLICATIONS

Huang, Science, 292, 1897, 2001.*
Cheng, S.L., et al., "Electroless Synthesis of Pure Nickel Metal Nanotubes Using Silicon Oxide Nanowires as Removable Templates," The Electrochemical Society; Electrochemical and Solid-State Letters, vol. 10, No. 12, pp. D142-D145 (2007).
An, Kwangjin, et al., "Synthesis and biomedical applications of hollow nanostructures," Elsevier; Nano Today, vol. 4, No. 4, pp. 359-373, (Aug. 1, 2009).
Yin, Yadong, et al., "Formation of Hollow Nanocrystals Through the Nanoscale Kirkendall Effect," Science, vol. 304, pp. 711-714, (Apr. 30, 2004).
Fan, Hong Jin, et al., "Formation of Nanotubes and Hollow Nanoparticles Based on Kirkendall and Diffusion Processes: A Review," Small, vol. 3, No. 10, pp. 1660-1671, (2007).

* cited by examiner

*Primary Examiner* — Joseph Miller, Jr.
(74) *Attorney, Agent, or Firm* — Kilpatrick Townsend & Stockton LLP (57) ABSTRACT

The present disclosure relates to a method for the synthesis of at least one metallic nanotube (10). The method includes the steps of: growing at least one nanowhisker (6) on a substrate (2), the nanowhisker (6; 12) consisting of or having a coating of a first metal (12); coating said first metal (12) with a second metal (14) to form a coated nanowhiskers (8); and heat treating the at least one coated nanowhisker (8), to produce a metallic nanotube (10). Moreover, the present teaching relates to metallic nanotubes (10) grown by the method of the present teaching.

2 Claims, 8 Drawing Sheets

METHOD FOR THE SYNTHESIS OF METALLIC NANOTUBES AND NANOTUBES SYNTHESIZED BY THE METHOD

CROSS REFERENCE TO RELATED APPLICATIONS

This application claims the priority of U.S. Provisional Application No. 61/238,022, filed on Aug. 28, 2009, the disclosure of which is incorporated herein by reference.

The present invention relates to a method for the synthesis of metallic nanotubes and to metallic nanotubes synthesized by the method.

Nanostructures are known in different forms, for example as quantum dots, nanoparticles, nanowires and nanotubes. Nanostructures are becoming increasingly more interesting to satisfy the demand of a wide variety of applications such as ever smaller and more compact integrated circuits, separation apparatuses, fuel cell components, catalytic conversion apparatuses and biological equipment. For this reason the production of nanostructures is becoming increasingly necessary.

Since nanostructures are not observed spontaneously in nature they must be produced in the laboratory. There are many known ways for forming nanostructures, which are normally synthesized in a laboratory environment.

One growth method is to use a substrate suspended in a growth chamber, the substrate typically consisting primarily of $SiO_2$. This substrate is treated with a catalyst, for example, this catalyst being randomly selected from one of Ag, Se, Au, ZnO. A solution is subsequently added to the growth chamber, with the substrate and the catalyst being immersed in this solution. The solution typically consists of a salt of the desired nanostructure, for example, a silicon salt for a Si nanostructure. A reducing agent, for example, hexamine, is subsequently added to the solution in the growth chamber. The solution is heated to a temperature of typically 140° C. and the growth chamber is maintained at this temperature for a period selected to obtain the desired size of the nanostructure.

Unfortunately, this growth process leads to a varied range of nanostructures. Moreover, the resultant nanostructures have to be separated from the remaining structures in subsequent steps which further reduces the already low yield.

In other fabrication methods which utilize molecular beam epitaxy (MBE) techniques in vacuum chambers, single crystalline metal wires, or metal whiskers with lengths larger than 10 μm have been fabricated and separated from their growth substrate they have then been used for experiments on their mechanical, ferromagnetic, superconductive and electronic properties.

One particular aspect of interest lies in the synthesis of hollow nanotubes. Various different techniques for manufacturing hollow nanotubes have been investigated. For example, using techniques of etching, where the core of a nanowire is etched resulting in a nanotube or by rolling layered materials to form nanoscrolls, for instance, semiconductor thin films are rolled up by strain release of a lattice mismatched film substrate interface. Also graphite films can be rolled up utilizing intercalation exfoliation. Unfortunately these methods do not produce single crystalline, defect free or freestanding nanotubes.

The object of the present invention is to provide single crystalline, substantially defect free and freestanding nanotubes.

This object is satisfied in accordance with the present invention, by a method for the synthesis of at least one metallic nanotube including the following steps:

growing at least one nanowhisker on a substrate, the nanowhisker consisting of or having a coating of a first metal; coating said first metal with a second metal to form a coated nanowhiskers; and
heat treating the at least one coated nanowhisker, to produce a metallic nanotube.

This method has the advantage that the growth of a nanowhisker on a substrate inherently leads to the synthesis of freestanding nanowhiskers. Moreover, heat treating the coated nanowhisker causes the nanowhisker, consisting of the first metal, or of a core with a coating of the first metal to diffuse in the direction of the second metal and/or in the direction of the substrate producing substantially defect free metallic nanotubes which also stand up from the surface of the substrate, i.e. are freestanding because the nanowhiskers on which they are grown are freestanding. Moreover, the heat treatment leads to the synthesized nanotubes being of substantially single crystal material.

By choosing suitable material combinations and tuning the heat treating parameters accordingly it is therefore possible to fabricate a variety of hollow nanotubes.

The second metal coating of the nanowhisker is also known as a nanocast, this nanocast (coating) typically has a thickness of 1 to 50 nm. Using thicker or thinner layers is naturally also possible, but it has been shown that using layer thicknesses, preferably in the range of 5 to 40 nm yield favourable results and the shortest fabrication times in the synthesis of metallic nanotubes.

It is possible that the substrate wafer requires cleaning prior to growing the at least one nanowhisker, to ensure that the substrate is clean at the start of the synthesis cycle. This cleaning can take place in a bath of ethanol and/or water and/or acetone. The cleaning can also include the step of cathodic etching, for example, for 90 s at 100 W and e.g. at a bias voltage of ∼−200V in a vacuum chamber, such as the chamber of a PVD coating apparatus, in an Argon atmosphere of $p \approx 10^{-3}$ mbar. The cleaning step can be any type of cleaning step routinely carried out by a person of ordinary skill in the art working with substrate wafers.

Once the substrate wafer has been cleaned, it is possible to grow nanowhiskers on it. In accordance with the method of the present invention, the nanowhiskers can have a diameter in the range of 10 to 300 nm, preferably in the range from 20 to 250 nm and most preferably in the range from 50 to 200 nm, and they can have a length in the range from 1 μm to 350 μm or more, preferably in the range from 5 μm to 200 μm and most preferably in the range from 10 μm to 75 μm. These are useful size ranges for nanotechnological applications.

In an embodiment of the present invention the substrate is a substrate wafer, preferably an epitaxial substrate wafer. The substrate wafer can optionally be chosen as either an oxidized substrate wafer or a nonoxidized substrate wafer from the group of substrate wafers including Si(100) wafers, Si(110) wafers, and Si(111) wafers.

Using an epitaxial wafer ensures that the starting material used, to grow the nanowhiskers in the method in accordance with the invention, is extremely clean and defect free, ensuring better starting conditions for the nanowhisker growth and thus the entire growth process is positively influenced with a higher accuracy during the production of the metallic nanotubes.

In an embodiment of the present invention, a growth promoter is applied to the substrate and is adapted to facilitate the growth of the at least one nanowhisker.

This is beneficial for the whisker formation, as in some cases a growth promoter is required for nucleation to take place. The nucleation sites yielded by the growth promoter, on the substrate, are sites at which nanowhiskers typically grow. Moreover, the growth promoter can influence the growth shape of the nanowhisker, e.g. in the preferred case leads to the axial growth of the nanostructure at the expense of radial growth, thus ensuring the growth of a nanowhisker, i.e. of whiskers with the desired aspect ratio (length to diameter ratio).

Moreover, some nanowhiskers require non-uniform surfaces and/or surface defects to be present on the substrate and/or the growth promoter to facilitate the growth of the nanowhisker, i.e. nucleation sites of the nanowhiskers are advantageously provided by providing the growth promoter on the substrate wafer.

It is also conceivable that substrate wafers can be acquired from a third party prior to the synthesis of the metallic nanotubes, with the substrate wafers already having a growth promoter or a growth layer provided on them.

In a further embodiment of the present invention, the first metal and the second metal are selected from the group of metals consisting of Ag, Au, Cu, Cr, Mo, Nb, Ni, Pd, Pt, Ta, V and W and combinations thereof, however, the first metal and the second metal have to be different from each other in that the first metal has a higher rate of diffusion into the second metal than vice versa.

By selecting one of the above metals for the first metal one can ensure that single crystalline metallic nanowhiskers and/or single crystalline coatings on nanowhiskers are formed, thus improving the synthesis process of metallic, single crystalline defect free and freestanding nanowhiskers, or coatings thereof. Moreover, by selecting the second metal from this group one can advantageously ensure that the second metal is a good material partner to the first metal and that the material combinations exhibit the so-called Kirkendall effect.

In particular, group VB metals are good material partners for group VIB metals and vice versa and also group VII metals are good material partners to group IB metals and vice versa. The only limitations are that both species must be able to interdiffuse into one another; however, the core material (first metal) has to diffuse faster into the second metal than vice versa. In this respect some classical material partners are Cu—Zn, SnPb—Cu and Ag—Au metals. Naturally, also other metals can be chosen as metal combinations for the metallic nanotubes.

In a further embodiment of the present invention, the first metal and the second metal are deposited by one of the following processes, PVD, CVD, and PECVD.

Using any one of these deposition processes, one can accurately control the structure, the adhesion and also the material properties of the deposited/grown nanostructure or layer of coating. The high-purity, solid growth (coating) material is deposited on the nanowhisker or the substrate as a thin, highly adhering structure or coating.

In a further embodiment of the present invention, the second metal forms a polycrystalline coating on the carbon coating of the substrate.

In some cases, one or more additional diffusion paths have to be activated to form an elongate hollow space, a pore, with a constant diameter over the complete length of the nanotube. One important diffusion path is the interface between the first and second metals. Another important diffusion path is formed by the grain boundaries formed as a polycrystalline coating of the first and second metals on the carbon coating of the substrate by the deposition of the first and second metals on the carbon coating adjacent to the coated nanowhisker.

Other diffusion paths can be surface diffusion at the pore surface which is an interface diffusion along dislocations in the starting structure formed by the nanowhiskers coated with the second metal, or possibly with the first and second metals. Using at least some of these diffusion mechanisms, material is surprisingly transported not just radially outwardly but also parallel to the tube axis, enabling the formation of a uniform diameter elongate inner pore with a smooth wall.

In a further embodiment of the present invention, the step of heat treating is carried out in air or in an inert gas atmosphere and at a temperature in the range from 120° C. to 600° C. for 50 to 100 hours.

Depending on the material combination used one tunes the fabrication parameters accordingly to fabricate hollow nanostructures. Different material combinations have different heating temperatures and different heating times for the synthesis of the nanotubes.

The present invention gives the person skilled in the art various ways of making tailor made hollow nanotubes, e.g. by selecting the parameters for the growth of the nanowhiskers these can be made with a range of desired materials, lengths and diameters. By controlling the deposition parameters for the second metal, the type of second metal, its microstructure and the thickness of the nano-coating can be determined. The length and the internal diameter of the nanotube are determined by the length and the diameter of the nanowhisker. By selecting the appropriate heat treatment temperature and/or duration the composition of the hollow nanotube and the smoothness and regularity of its internal passage can be determined.

In a further embodiment of the present invention, during the step of heat treating, the first metal is diffused into a grain boundary of the second metal, particularly adjacent the surface of the substrate.

Using this particular diffusion mechanism, for example, in the growth of Au(Ag) metallic nanotubes, the Ag material can be transported generally parallel to the tubular axis, enabling the formation of a hollow passage or pore with a substantially uniform internal diameter inner pore and a smooth wall.

In a further embodiment of the present invention, the nanotubes may be subsequently separated from the substrate prior to their use or they may be used attached to the substrate.

Thus, depending on the further application of the nanotubes, it may be beneficial to separate them from the substrate and use them either singly or in a combined manner, e.g. in the form of a bundle of parallel nanotubes. A single nanotube could be useful for biologically manipulating parts of genes, or as a pipette tip for ultra small quantities of fluid. A bundle of nanotubes could be useful for a catalytic converter or as a small fuel cell or as a filter. It could also be beneficial to use the metallic nanostructure on the substrate, for example, to attach further nanostructures to the nanotube to produce nanoscale electric circuits or, to carry out experiments on the metallic nanotubes as grown.

In a further embodiment of the present invention, the growth promoter is adapted to facilitate the growth of a nanowhisker consisting of the first metal.

Growing a metallic nanowhisker consisting of the first metal has the advantage that one directly obtains the metallic nanotube at the end of the synthesis process.

In a further embodiment of the present invention, the growth promoter is a growth layer and said growth layer is achieved by depositing, for example, a 1 to 40 nm thick carbon layer on said substrate wafer by one of the following processes: PVD, CVD, and PECVD.

Growing metallic nanowhiskers can require a carbon layer, to form growth and/or nucleation sites for the nanowhiskers. Such nucleation sites are typically to be found at defects in the carbon layer. It has been found that for carbon layers below 1 nm nucleation does not take place. For a carbon growth layer above approximately 40 nm in thickness nucleation no longer occurs. Typically carbon layers of 10 nm to 30 nm are preferred.

It has been found, that the growth layer can also comprise growth sites which can be formed by depositing, for example, nanoparticles onto the substrate wafer as nucleation growth sites.

In a further embodiment of the present invention, the step of heat treating is carried out at a temperature in the range of approximately 145° C. to 155° C. for approximately 65 to 75 hours for Ag-core/Au-shell coated nanowhiskers, in the range of approximately 140° C. to 150° C. for approximately 20 to 30 hours for Ag-core/Pd-shell coated nanowhiskers, approximately 200° C. to 250° C. for approximately 100 to 130 hours for Cucore/Ni-shell coated nanowhiskers The temperature and pressure ranges quoted for Ag/Au yield the best results for synthesizing free standing, metallic, single crystalline, defect free Au(Ag) nanotubes. Tests have shown that an optimum diffusion is achieved at a temperature of 150° C. and heating for 70 hours.

In a further embodiment of the present invention, the growth promoter is adapted to facilitate the growth of a non-metallic nanowhisker.

Growing a non-metallic nanowhisker, such as a carbon nanowhisker, a ZnO nanowhisker, or an Si nanowhisker has the advantage that the length and diameter of the nanowhisker grown can be varied more easily and more diverse nanowhisker ranges can be grown. This leads to an increased number of nanowhisker size ranges and an increased number of aspect ratios (length to diameter ratios), i.e. an increase in the number of different sized nanotubes is achieved.

Having grown at least one nanowhisker on a substrate, the non-metallic nanowhiskers can then be coated with a coating of a first metal, such as Ag. The first metal can then in turn be coated with a second metal to form a coated nanowhisker. Subsequent heat treatment of the coated nanowhisker leads to a metallic nanotube having a core consisting of a non-metallic nanowhisker. The core consisting of a non-metallic nanowhisker can subsequently be removed from the nanotube to form a hollow nanotube.

In a further embodiment of the present invention, the non-metallic nanowhisker is a semiconducting nanowhisker which is grown by a VLS growth mechanism.

Producing non-metallic nanowhiskers using a variety of growth mechanisms is highly beneficial, as different types of growth mechanisms influence the size distribution of non-metallic nanowhiskers differently. This enables a more selective growth process for the metallic nanotube production, e.g. if the user requires an Au nanotube, he would advantageously use a deposition growth mechanism to deposit a second metal layer of Au on e.g. a first metal layer of Ag.

In a further embodiment of the present invention, the method further includes the step of removing said metallic nanotube from said non-metallic nanowhisker or vice versa.

Moreover, the present invention provides a metallic nanotube synthesized by one of the inventive methods described above.

The invention will now be described in more detail with reference to the embodiments in the accompanying drawings in which are shown.

Throughout the specific description, the same reference numerals will be used for features having the same or similar technical functions.

Figure 1A:
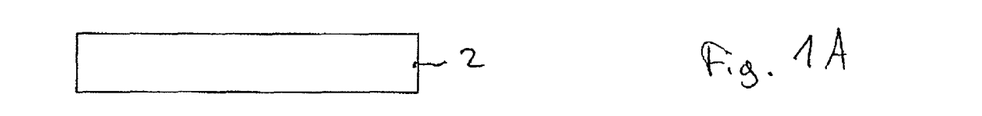
FIGS. 1A to 1F the method steps in accordance with the present invention.

FIG. 1A shows an epitaxial Si(100) substrate wafer 2 which forms a possible starting point for the method of the present teaching. This substrate wafer 2 is cleaned prior to its use in a bath of acetone and ethanol. It is subsequently further cleaned by a cathodic etching step for 90 s at 100 W and ~−200 V substrate bias in an argon atmosphere with a pressure of $p \approx 10^{-3}$ mbar in a vacuum chamber 16 (see FIG. 10) equipped for magnetron sputtering and sputter etching using the argon ions present in the chamber. If an Si wafer 2 is obtained in a pre-cleaned state then the steps of cleaning in acetone and ethanol and possibly also the step of cathodic etching may not be required. They do, however, improve the cleanliness of the substrate wafer 2 at the start of the synthesis cycle. Moreover, the substrate wafer 2 chosen could easily be any form of epitaxial substrate wafer 2, more particularly it could be chosen as an oxidized substrate wafer 2 or as a non-oxidized substrate wafer 2 from the group of substrate wafers 2 including Si(100) wafers, Si(110) wafers, and Si(111) wafers. In some embodiments the substrate wafer 2 could also be a non-epitaxial wafer.

Figure 1B:
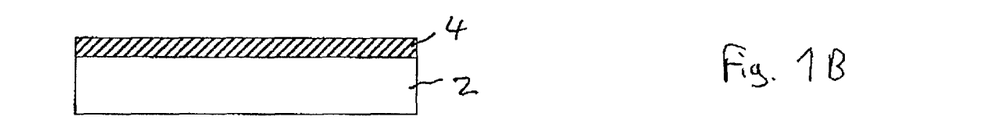

FIG. 1B shows the substrate wafer 2, covered with a layer of carbon which is formed on the substrate wafer 2 by magnetron sputtering in the vacuum chamber 16 using a graphite target. Having regard to its function this carbon layer 4 is also termed a growth promoter 4 or a growth layer 4. The layer thickness is chosen to be in the range of 1 to 50 nm. Other types of growth promoters could be, for example, $SiO_x$, $Si_xN_y$, AlN.

Figure 1C:
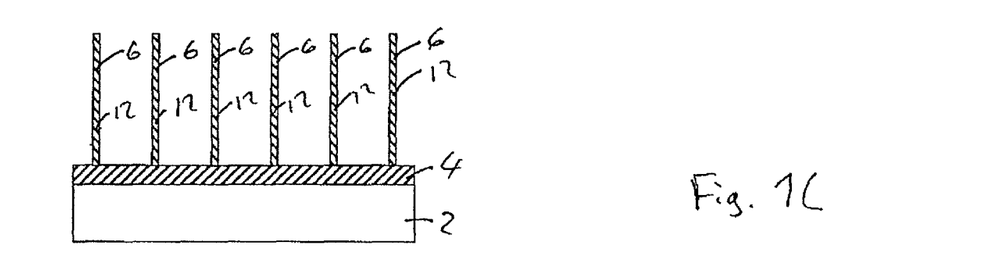

FIG. 1C, shows the substrate wafer of FIG. 1A, on which freestanding single crystalline nanowhiskers 6 have been grown, in this case using molecular beam epitaxy (MBE) as will be discussed later in detail. In the present example, the nanowhiskers 6 are silver nanowhiskers 6, and grow on the Si substrate wafer 2, at defects 5 (see FIG. 1F) in the carbon growth layer 4. The nanowhiskers 6 of FIG. 1C, consist of a first metal 12.

Figure 1D:
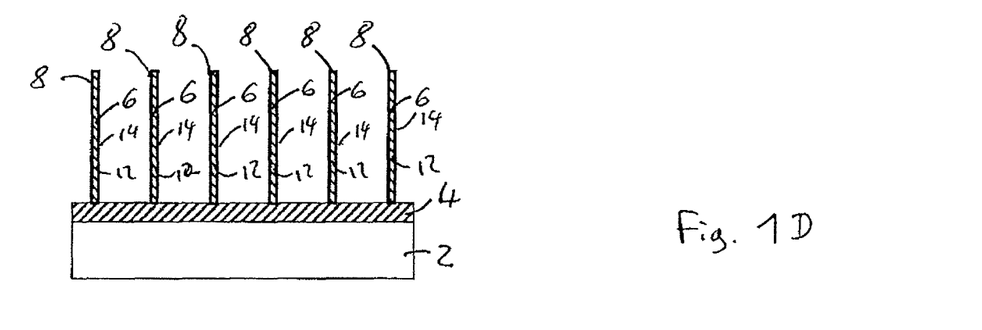

FIG. 1D, shows the coated nanowhiskers 8, in which a second metal 14 has been deposited as a coating on the nanowhisker 6 forming a coated nanowhisker 8. In this case the second metal 14 consists of gold.

Figure 1E:
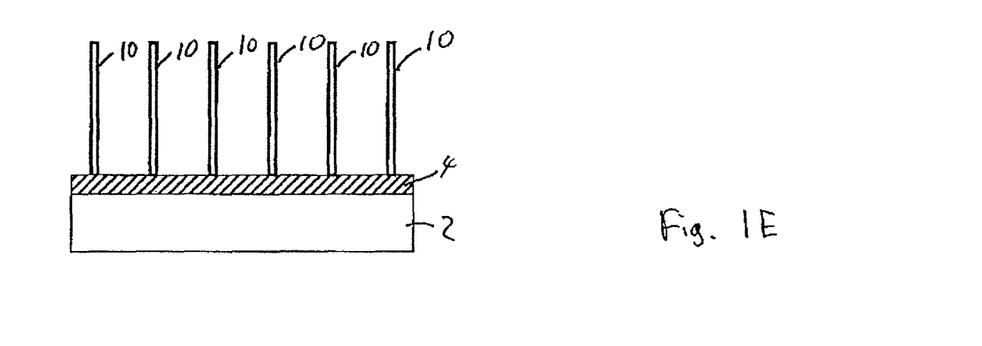

FIG. 1E shows the substrate 2 with the growth promoter 4 and a plurality of hollow metallic nanotubes 10 which result after the step of heat treatment.

Figure 1F:
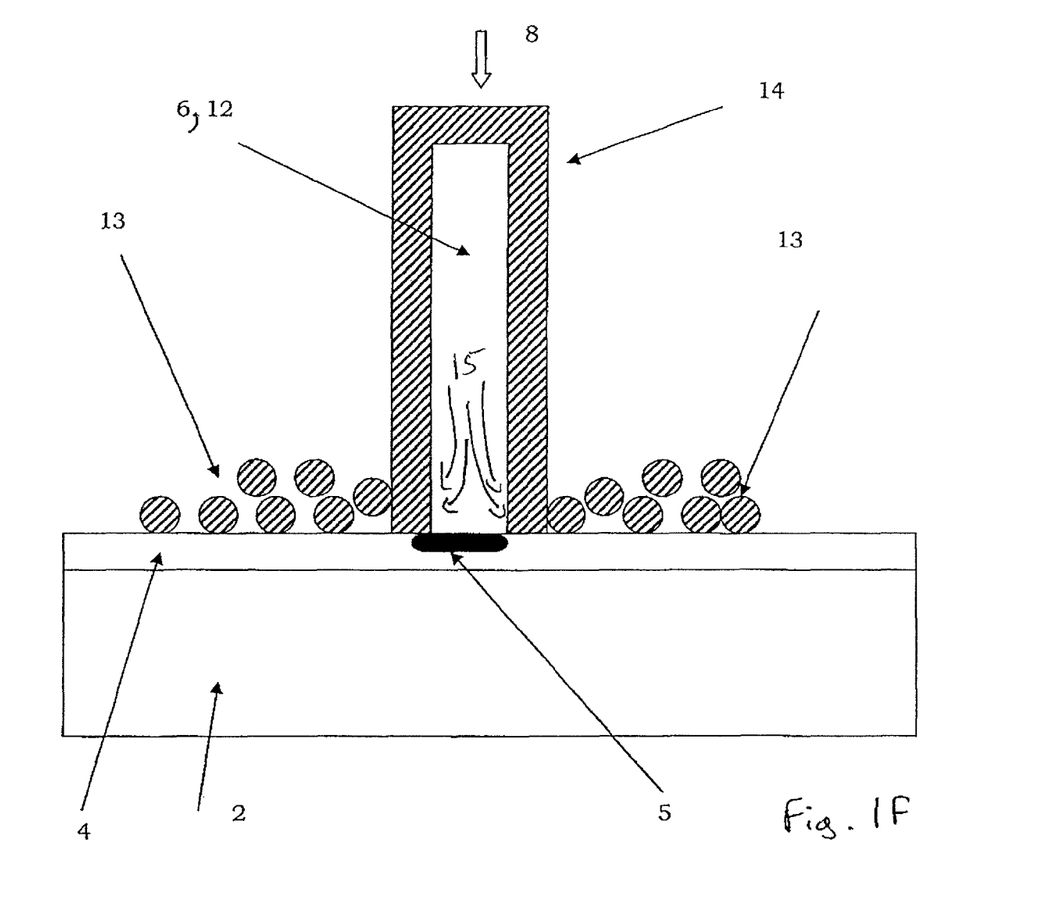

The effect of the heat treatment step can best be explained with reference to FIG. 1F. FIG. 1F shows a coated nanowhisker 8 during the step of heat treatment. The nanowhisker 6 was grown using an MBE method, the growth of the nanowhisker 6 took place at the site of a defect 5 in the carbon layer 4 provided on the substrate 2. This defect 5 permits the growth of the nanowhisker 6 and leads to the single crystal structure of the nanowhisker 6. The nanowhisker 6 was subsequently coated with the second metal 14, the second metal 14 formed a substantially single crystal layer on the nanowhisker 6 and a polycrystalline second metal layer 13 on the carbon layer 4. During the heating step, the first metal 12 of the nanowhisker 6 is predominantly diffused in the direction of the arrows 15 shown in FIG. 1F and surprisingly not predominantly in the direction of the coating consisting of the second metal 14, i.e. the first metal mainly diffuses into a grain boundary 13 of the polycrystalline second metal layer 13 on the carbon layer 4 and not into the single crystal second metal layer 14. This diffusion allows the synthesis of freestanding substantially defect free single crystal metallic nanotubes 10.

The Kirkendall effect which is discussed, for example, in the publications by, H. J. Fan et al., *Nat. Mater.* 5, 627-631 (2006), Y. G. Li, B. Tan, Y. Y. Wu, *J. Am. Chem. Soc.* 128, 14258-14259 (2006), C. H. B. Ng, H. Tan, W. Y. Fan, *Langmuir* 22, 9712-9717 (2006), X. Y. Chen, Z. J. Zhang, Z. G. Qiu, C. W. Shi, X. L. Li, *J. Colloid Interface Sci.* 308, 271-275 (2007) and E. O. Kirkendall, *Trans. AIME* 147, 104-109 (1942), postulates that in diffusion processes across the interface of two adjoining materials an unequal diffusion flow of the adjoining materials takes place across the interface causing characteristic pores near the interface on the side of the faster diffusing species. The diffusion across the interface is balanced by a flow of vacancies, agglomerating on the side of the faster diffusing species and forming pores. Prominent Kirkendall partners are Cu—Zn, SnPb—Cu, Ag—Au for metals and ZnO—$Al_2O_3$ for ceramics.

This effect was utilized in the synthesis of nanospheres as is discussed in the publications by Y. Sun, Y. Xia, *Science* 298, 2176-2179 (2002) and H. J. Fan et al., *Solid State Commun.* 130, 517-521 (2004). However, in contrast to the present teaching the wall of these core-shell structures is made from an alloy of the two species. In particular, for nanospheres it was found that the faster diffusing species in the core diffuses outwardly and the slower diffusing species diffuses inwardly, but in such a way that a hollow cavity arises at the centre. This hollow cavity is surrounded by material consisting of predominantly the faster diffusing species but with a composition changing to predominantly the slower diffusing species at the outside.

Thus, using the method of the present teaching surprisingly the Kirkendall diffusion process is not the dominant diffusion path in the synthesis of metallic nanotubes, but in fact a previously unknown diffusion path towards the substrate 2 into the polycrystalline second metal layer 13 provided on the carbon layer 4. Moreover, should someone have proposed coating a similar wire with a layer of gold then by analogy with the nanosphere case one would have expected to achieve a hollow structure whose wall consists of a porous alloy of the two materials used in the synthesis of the nanostructure and not a single crystal substantially defect free nanotube 10.

Thus, using the present teaching it is surprisingly possible to grow hollow, freestanding Au(Ag) nanotubes 10 attached on a surface of a substrate 2. The nanotube 10 wall is substantially defect free except for stacking faults. The main diffusion process occurring was not the diffusion of Ag into the Au shell as expected, but the incorporation of Ag into the Au grain boundaries 13 on the substrate 2, thus depleting the interior of the core-shell structure 8 and leaving a predominantly Au nanotube 10 with only a small proportion of Ag.

In all embodiments shown in the present application, the first metal 12 and the second metal 14 can be chosen from the group of metals consisting of Ag, Au, Cu, Cr, Mo, Nb, Ni, Pd, Pt, Ta, V and W and combinations thereof, however, the first metal 12 must be chosen such that it has a higher rate of diffusion into the second metal 14 than vice versa, to produce substantially defect free freestanding nanotubes. Advantageously, the growth promoter 4, the first metal 12 and the second metal 14 are deposited either in a PVD or a CVD and/or a PECVD process in an evacuated vacuum chamber 16 (see FIG. 10).

Figure 2A:
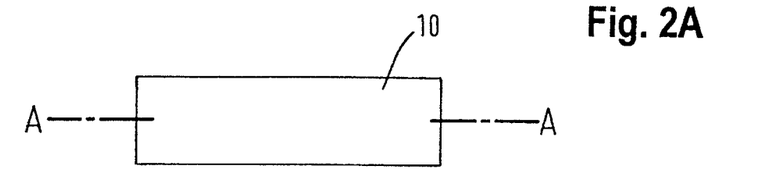
FIG. 2A a nanotube produced by the method of the present invention.

FIG. 2A shows a typical nanotube, in this case an Au nanotube 10 with residual traces of Ag (also known as a Au(Ag) nanotube 10, i.e (Ag) means residual traces of the Ag core are present in the nanotube 10 comprising generally Au), the length of the nanotube is approximately 200 μm and the diameter of the nanotube 10 is approximately 130 nm. Nanotubes with lengths in the range from 1 μm to 350 μm can readily be grown.

Figure 2B:
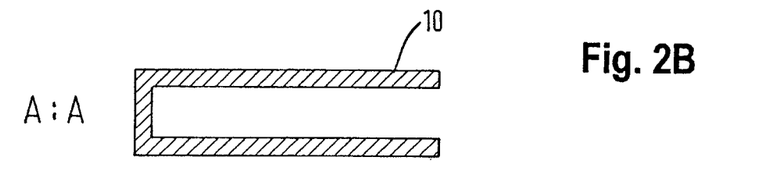
FIG. 2B a section of an illustration of the nanotube of FIG. 2A.

FIG. 2B shows a section along the sectional line AA of FIG. 2A of the nanotube 10, the thickness of the walls of the second metal 14 is approximately 15 nm.

Figure 3:
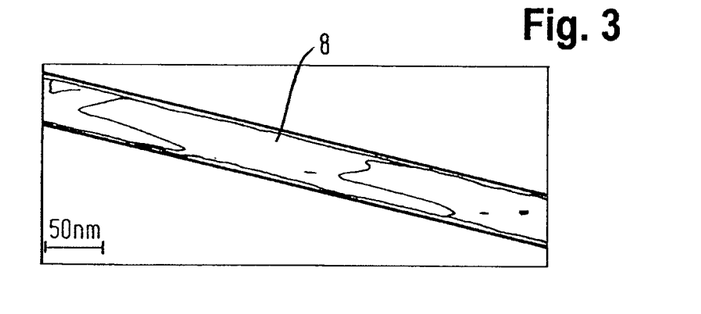
FIG. 3 a conventional TEM picture of an Au—Ag core/shell structure.

FIG. 3 shows a conventional TEM picture of an Au-core/Ag-shell structure (coated nanowhisker 8). The estimated overall diameter of the coated nanowhisker 8 is approximately 50 nm, and the Au wall thickness is approximately 15 nm. Only for nanowhiskers with small diameters, like the one shown with d=45 nm and using a high-voltage TEM is it possible to resolve a contrast difference between the Ag core and the Au shell.

For the TEM specimen preparation, standard carbon polymer film coated Cu TEM grids were used. The TEM grid was pulled with the carbon film down over the surface of the non-heat treated comparison specimen and the heat treated specimens. A fraction of the core-shell nanowhiskers 8 and nanotubes 10 were broken of the surface of the substrate 2 and were assembled on the surface of the lacy carbon film 4. No further specimen preparation was necessary nor carried out.

Figure 4:
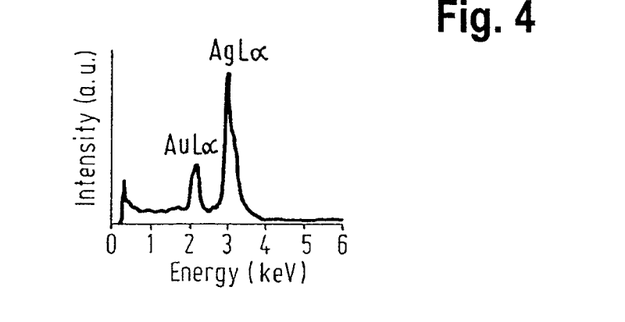
FIG. 4 an EDX spectrum of a single coated nanowhisker.

FIG. 4 shows an EDX spectrum of a single coated nanowhisker 8, the intensity ratios of the Au Mα and the Ag Lα are approximately 0.5 confirming the presence of Au and Ag in the coated nanowhisker 8. It should be noted, that the Au Mα and the Ag Lα lines are the emission lines that result when an electron transitions to the innermost "K" shell, i.e. when the nanotubes 10 are bombarded with energy sufficient to cause x-ray emission, then the material of the nanotubes emit element specific characteristic x-ray transitions and from the intensities of the x-ray transitions recorded one can establish the relative amount of material present in the specimen.

By deposition of Au at room temperature, an epitaxial film is formed on the surface facets of the Ag nanowhisker 6, as expected. No contrast in grain boundary is seen in the bright field micrograph, nor is there a contrast from misfit dislocations. Also no dislocations in the bulk of the Ag core or the Au film were detectable in the bright or the dark field micrographs. Only bending contours from the TEM specimen preparation and the momentum of the electron beam are visible. The thickness of the Au shell is close to the deposited nominal film thickness.

For the microstructure characterization, a LEO field emission scanning electron microscope (SEM) (LEO 1250 VP) was used with acceleration voltages from 3-10 kV to characterize the morphology of the Au-core/Ag-shell core-shell nanowhiskers 8 and the Au(Ag) nanotubes 10 on the carbon coated Si(100) wafers 2. The SEM is equipped with an Oxford Instruments EDX detector. The EDX spectra were taken using an electron beam energy of 10 keV. The microstructural analysis of single core-shell structures and nanotubes 10 was conducted in two different transmission electron microscopes both in conventional mode. Since Au and Ag exhibit a high absorption length the Au/Ag nanowhiskers 8 were characterized in a high voltage TEM (JEOL 1250 ARM) with an acceleration voltage of 1250 kV. The nanotubes 10 were studied in a Philips CM 200 microscope equipped with an EDAX EDXS system. The latter microscope has a typical beam energy of 200 keV.

Figure 5:
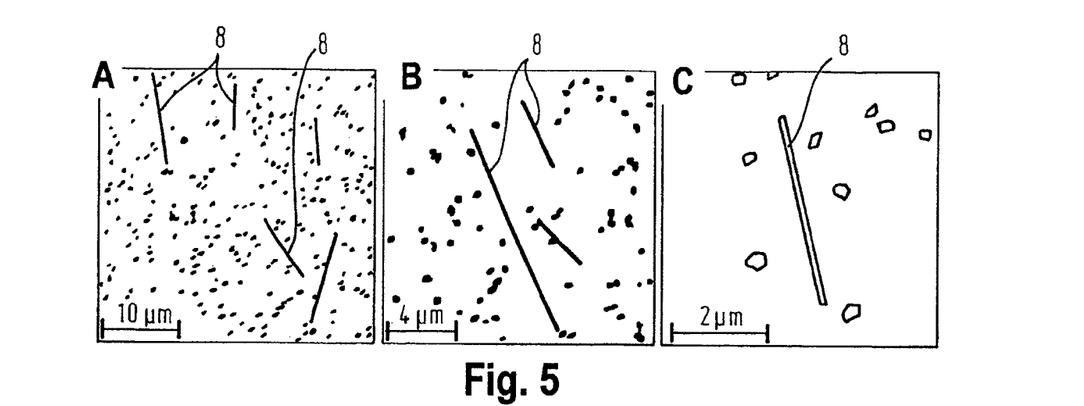
FIG. 5 SEM micrographs of nanowhiskers grown in accordance with the present invention, FIG. 6A to C SEM micrographs of nanotubes grown in accordance with the present invention, FIG. 6D conventional TEM picture of an Au(Ag) nanotube in accordance with the present invention, FIGS. 6E-G TEM micrographs of single nanotube in accordance with the present invention, FIG. 6H EDX spectrum of a nanotube in accordance with the present invention, FIGS. 7A and 7C SEM images of grown annealed microstructures in accordance with the present invention, FIG. 7B EDX spectrum of grown nanowhiskers having a gold film in accordance with the present invention, FIG. 7D EDX spectrum of the heat treated specimen of FIG. 7B in accordance with the present invention, FIG. 7E schematic of nanotube formation in accordance with the present invention, FIG. 8 conventional TEM micrograph of a heat treated Ag nanowhisker in accordance with the present invention, FIG. 9 growth of a metallic nanotube on a non-metallic nanowhisker in accordance with the present invention, FIG. 10 a vacuum system.

FIG. 5A to C show SEM micrographs of grown Au-core/Ag-shell coated nanowhiskers 8, in particular, they show SEM micrographs of nanowhiskers 8 attached to the carbon-coated Si(100) substrate 2. The images were taken at an angle of 55° to the surface normal. The nominal Ag film thickness was ~90 nm, the Au film thickness ~15 nm. The coated nanowhiskers 8 have a length of up to 15 µm; the typical diameter is ~100 nm. The inclination angle of the whisker axis to the surface normal was a maximum of 60°.

A number of examples of methods of growing nanowhiskers will now be given. Free-standing, high aspect ratio, single crystalline nanowhiskers 6 of a variety of different materials (copper, gold, silver, aluminum, and silicon) can be successfully grown from partially carbon coated, oxidized and nonoxidized Si (100), (110), and (111) substrate wafers 2 under molecular beam epitaxy (MBE) conditions. Both elevated substrate temperatures (on the order of 0.65 ™ of the deposited species) and the partial carbon layer are necessary to achieve the growth of metallic nanowhiskers 6.

Some specific examples of nanowhisker and nanotube preparation will now be given.

EXAMPLE 1

Growth of Cu Nanowhiskers 6

An epitaxial Si(110) substrate wafer 2 was cleaned in acetone and ethanol and subsequently placed into a vacuum chamber 16. The vacuum chamber 16 was flushed with Argon to produce an argon atmosphere. The chamber 16 was subsequently evacuated using a vacuum pump system 22 to a pressure of $p \approx 10^{-3}$ mbar. Subsequently a bias voltage of ~-200V was applied to the substrate wafer 2. By applying a bias voltage to the substrate wafer 2 this then acts as a cathode with respect to the floating potential of the vacuum chamber 16. Subsequently the step of cathodic etching was carried out for 90 s at 100 W. In the cathode etching step the argon ions present in the chamber are accelerated towards the cathode (substrate wafer 2) "knocking" impurities from the surface of the substrate wafer 2 and thereby cleaning it.

After removal of the bias voltage, using a magnetron sputtering source with a carbon (graphite) target, a 30 nm thick layer of carbon was deposited on the substrate 2. The temperature of the chamber 16 was maintained at room temperature. If required, the chamber 16 can be equipped with either an internal heating source 28 (see FIG. 10) or, an external heating source 29 (not shown), to alter the temperature within the vacuum chamber 16.

Following the deposition of the carbon layer 4, Cu is deposited on the substrate 2 using an MBE technique. The wafer 2 was transferred to a vacuum chamber 16 which can obtain ultrahigh vacuum conditions (UHV), i.e. vacuum pressures of less than $p \approx 10^{-8}$ mbar typically in the range of $p \approx 10^{-10}$ mbar to $p \approx 10^{-12}$ mbar. At defects 5 in the carbon layer 4, the nanowhisker 6 grows as a single crystal Cu nanowhisker 6. Varying deposition times lead to different sized Cu nanowhiskers 6 particularly to nanowhiskers 6 of different lengths. Different deposition sources 18 (e.g. PVD or CVD) have different rates of deposition for different metal materials, e.g. rates of deposition in the range from 0.005 nm/s to 0.1 nm/s are found for different deposition sources 18 for different metals. Thus, in order to grow, for example, an approximately 2 µm long nanowhisker the deposition time has to be varied according to the deposition source 18 and the metal deposited. In the case of Cu the deposition temperature was Tcu=680° C. on the substrate surface 2. The deposition rate was $R_{Cu}$=0.05 nm/s. These values were obtained with a process having the following parameters: source: effusion cell from MDC Caburn, $T_{cell}$=1400° C.

The carbon coated substrate could also be removed from the vacuum chamber 16 used for magnetron sputtering and inserted into a further vacuum chamber 16 equipped with a different deposition source 18 (see FIG. 10) e.g. an MBE vacuum chamber 16, optionally via a vacuum lock, for growing of the nanowhiskers. Alternatively the vacuum chamber 16 could be equipped with a variety of deposition sources 18 negating the need for removing the substrate 2 between different coating steps, but requiring additional vacuum generating apparatuses.

Metallic nanowhiskers 6 could not be found on substrates without a carbon layer 4 and also did not grow on samples where the carbon layer 4 was thicker than 40 nm. Although the effect of different carbon layer thicknesses has been investigated, no correlation between the whisker 6 dimensions and carbon layer 4 thickness could be identified. It has also been found that whisker 6 growth is suppressed on flat and clean substrate wafers 2. Microscopic observations of the nanowhiskers 6 show that they have a strong tendency to form directly on the oxidized Si wafer 2 at openings in the carbon film 4.

From scanning electron microscopy (SEM) images, it was found that the axis of the majority of the whiskers 6 has an angle of less than 30° to the substrate normal. Although the whiskers 6 show no taper, they grow in length and diameter during deposition. This was qualitatively confirmed by experiments where different amounts of Cu were deposited and the dimensions of the resulting whiskers were observed using SEM. Typically, the whiskers exhibit a wide distribution of diameters ranging from 20 to 100 nm and an average length of approximately 10 µm, giving aspect ratios as large as 300. Larger nominal Cu film 4 thicknesses produce larger whisker 6 lengths and diameters up to 300 nm in diameter and 350 µm in length.

Microscopy investigations of other nanowhiskers 6 of Cu and other materials (Ag, Au, Al, Si) show that the whiskers 6 investigated are also dislocation-free.

Energy filtered TEM was used to determine the cross-sectional shape of the whiskers 6 and to rule out extensive contamination. The uniformity of the Cu intensity in the nanowhisker 6 images indicates the absence of thick surface oxides or growth catalyst particles. Thickness maps derived from electron energy loss spectroscopy (EELS) measurements for a 75 nm diameter nanowhisker 6 clearly indicate faceting of the nanowhisker 6. All TEM micrographs suggest faceting of the ends of the nanowhiskers 6 as well.

The faceted shapes of the nanowhiskers 6 are in accordance with previous observations of whisker growth and suggest that surface energy plays an important role in whisker formation and growth.

The well defined facets suggest that the growth is a near equilibrium process. No structural contaminations on the surface or in the bulk of the nanowhisker 6 are detectable. A thin layer presumably consisting of CuO was found which most likely formed on the whisker surface after removal from the vacuum system (16 see FIG. 10). In particular, no ordered carbon contamination can be seen on the surface. The results from such Cu nanowhiskers 6 are representative for all materials. Similar high aspect ratios, single crystalline growth was also achieved for Ag, Au, Al, and Si. Distributions in density, diameter, and length varied from material to material and may originate from the nanowhisker 6 formation and growth process itself.

Two processes must occur for whisker formation: first, nucleation has to take place, and subsequently axial growth at the expense of radial growth. In the case where carbon is essential to the whisker formation process, carbon must play a role in one or both steps. The effect of carbon morphology on Cu diffusion is well known and will surely influence the location and density of whisker nuclei.

Whiskers 6 have also been grown by the vapour liquid solid method (VLS) or metal halide reduction, the latter of which has demonstrated high strength. This has been attributed to the near-equilibrium nature of the growth process and the resultant absence of defects and flaws in the samples. Extending the fabrication of high quality metal whiskers 6 to submicrometer diameters, as routinely produced for semiconductors, is desired.

EXAMPLE 2

Au Nanowhiskers 6

An epitaxial Si(110) substrate wafer 2 was cleaned in acetone and ethanol and subsequently placed into a vacuum chamber 16. Subsequently the step of cathodic etching was carried out for 90 s at 100 W and a bias voltage of ~−200 V.

Following this a 30 nm layer of carbon was deposited on the substrate 2. then Ag was deposited on the substrate 2 using the MBE technique. At defects 5 in the carbon layer 4, the Au nanowhisker 6 grows as a single crystal Au nanowhisker 6. Varying deposition times lead to different Au nanowhisker 6 sizes. In this case, the deposition temperature was $T_{Au}$=800° C. on the substrate surface 2. The deposition rate was $R_{Au}$=0.05 nm/s.

EXAMPLE 3

Ag Nanowhiskers 6

An epitaxial Si(100) substrate wafer 2 was cleaned in acetone and ethanol and subsequently placed into a vacuum chamber 16. Subsequently the step of cathodic etching was carried out for 90 s at 100 W and a bias voltage of −200.

Following this a 40 nm layer of carbon was deposited on the substrate 2. then Ag was deposited on the substrate 2 using the MBE technique. At defects 5 in the carbon layer 4, the Au nanowhisker 6 grows as a single crystal Au nanowhisker 6. Varying deposition times lead to different Au nanowhisker 6 sizes. In this case, the deposition temperature was $T_{Ag}$=725° C. on the substrate surface 2. The deposition rate was $R_{Ag}$=0.05 nm/s.

EXAMPLE 4

Al Nanowhiskers 6

An epitaxial Si(111) substrate wafer 2 was cleaned in acetone and ethanol and subsequently placed into a vacuum chamber 16. Subsequently the step of cathodic etching was carried out for 90 s at 100 W and a bias voltage of −200.

Following this a 20 nm layer of carbon was deposited on the substrate 2. then Al was deposited on the substrate 2 using a PVD method in which (Dad help). At defects 5 in the carbon layer 4, the Al nanowhisker 6 grows as a single crystal Al nanowhisker 6. Varying deposition times lead to different Al nanowhisker 6 sizes. In this case, the deposition temperature was $T_{Al}$=525° C. on the substrate surface 2. The deposition rate was $R_{Al}$=0.05 nm/s.

EXAMPLE 5

Si Nanowhiskers 6

An epitaxial Si(111) substrate wafer 2 was cleaned in acetone and ethanol and subsequently placed into a vacuum chamber 16. Subsequently the step of cathodic etching was carried out for 90 s at 100 W and a bias voltage of −200.

Following the cleaning step, a thin (~1 to 10 nm) C film is deposited onto the substrate 2 by magnetron sputtering.

The substrate is then heat treated at temperatures higher than the Au—Si eutectic point, creating Au—Si alloy droplets on the substrate wafer surface 2 (the thicker the Au film, the larger the droplets). Mixing Au with Si greatly reduces the melting temperature of the alloy as compared to the alloy constituents. The melting temperature of the Au:Si alloy reaches a minimum at ~363° C. when the ratio of its constituents is 4:1 Au:Si, also known as the Au:Si eutectic point.

Figure 10:
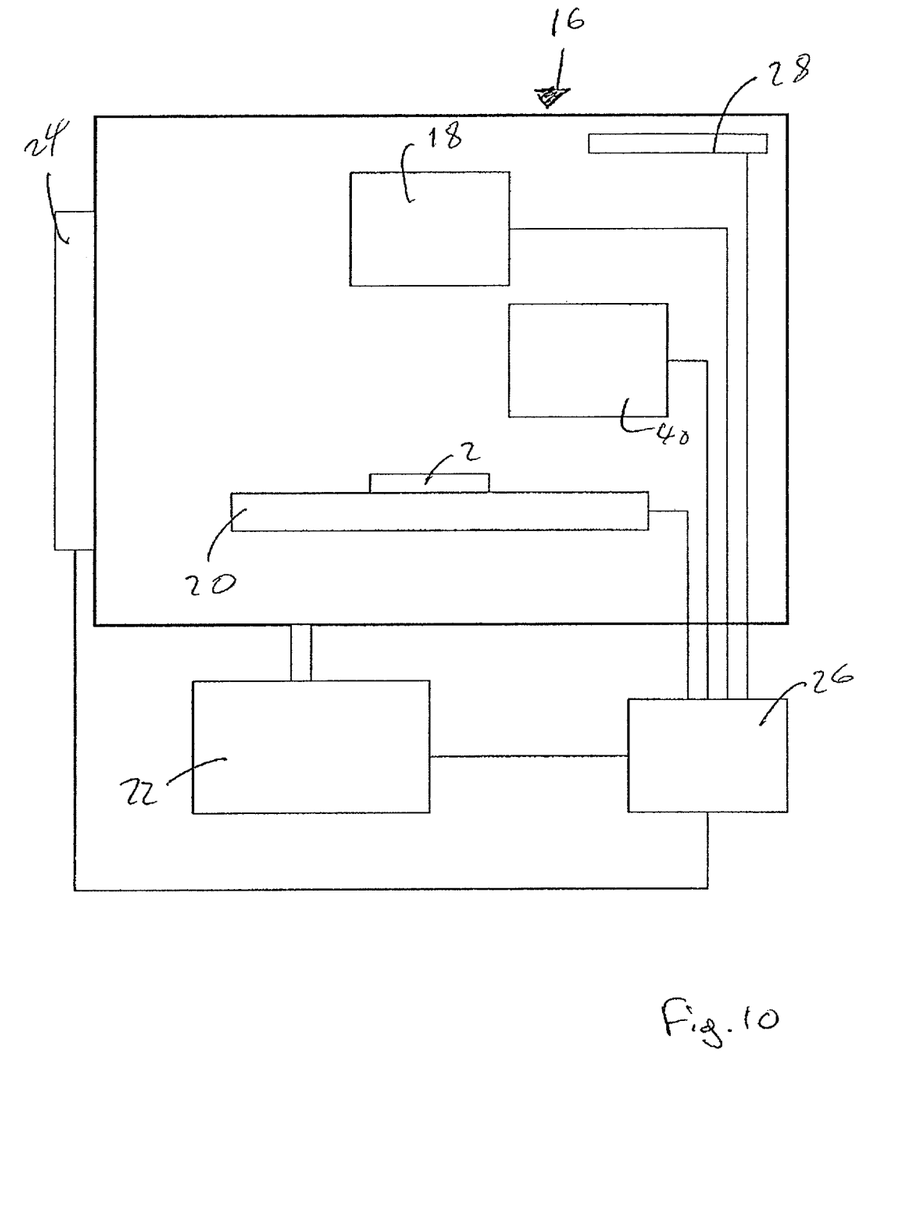

Nanowhiskers 6 are then grown by a liquid metal-alloy droplet-catalyzed chemical or physical vapor deposition process, which takes place in the vacuum deposition system 18 (see FIG. 10). Au—Si droplets on the surface of the substrate act to lower the activation energy of normal vapor-solid growth. For example, Si can be deposited by means of a SiCl4:H2 gaseous mixture reaction (chemical vapor deposition), only at temperatures above 525° C., in normal vapor-solid growth or be means of MBE.

Moreover, below this temperature almost no Si is deposited on the growth surface. However, Au particles can form Au—Si eutectic droplets at temperatures above 363° C. and adsorb Si from the vapor state (due to the fact that Au can form a solid-solution with all Si concentrations up to 100%) until reaching a supersaturated state of Si in Au. Furthermore, nanosized Au—Si droplets have much lower melting points due to the fact that the surface area-to-volume ratio is increasing, becoming energetically unfavorable, and nanometer-sized particles act to minimize their surface energy by forming droplets (spheres or half-spheres).

Si has a much higher melting point (~1414° C.) than that of the eutectic alloy, therefore Si atoms precipitate out of the supersaturated liquid-alloy droplet at the liquid-alloy/solid-Si interface, and the droplet rises from the surface. This result of this process can be seen in FIG. 9.

EXAMPLE 6

Nanotube Production

An example of nanotube 10 growth is the growth of Au nanotubes 10, for this, Ag nanowhiskers were grown via a carbon mediated physical vapour deposition technique as in Example 3 above. After growth of the nanowhisker Au deposition was carried out in an ultra-high vacuum (UHV) molecular beam epitaxy (MBE) system with the pressure never exceeding $2 \cdot 10^{-10}$ mbar. The MBE chamber was equipped with a resistivity heater temperature calibrated by an external thermocouple. Afterwards the specimen was cooled to $T_{Au}$=30° C. for gold deposition and Au was deposited with a rate of $R_{Au}$=0.01 nm/s. The gold material was evaporated from an effusion cell (as was the Ag material from an Ag effusion cell. After growth the specimens were removed from the vacuum and broken into two parts. The heat treatment was carried out under Air at 150° C. for 70 h for one of the parts leaving the other as a pre-heated reference sample.

FIG. 6A to H show heat treated Au-core Ag-shell coated nanowhiskers 8, which were heat-treated at 150° C. for 70 hours.

Figure 6:
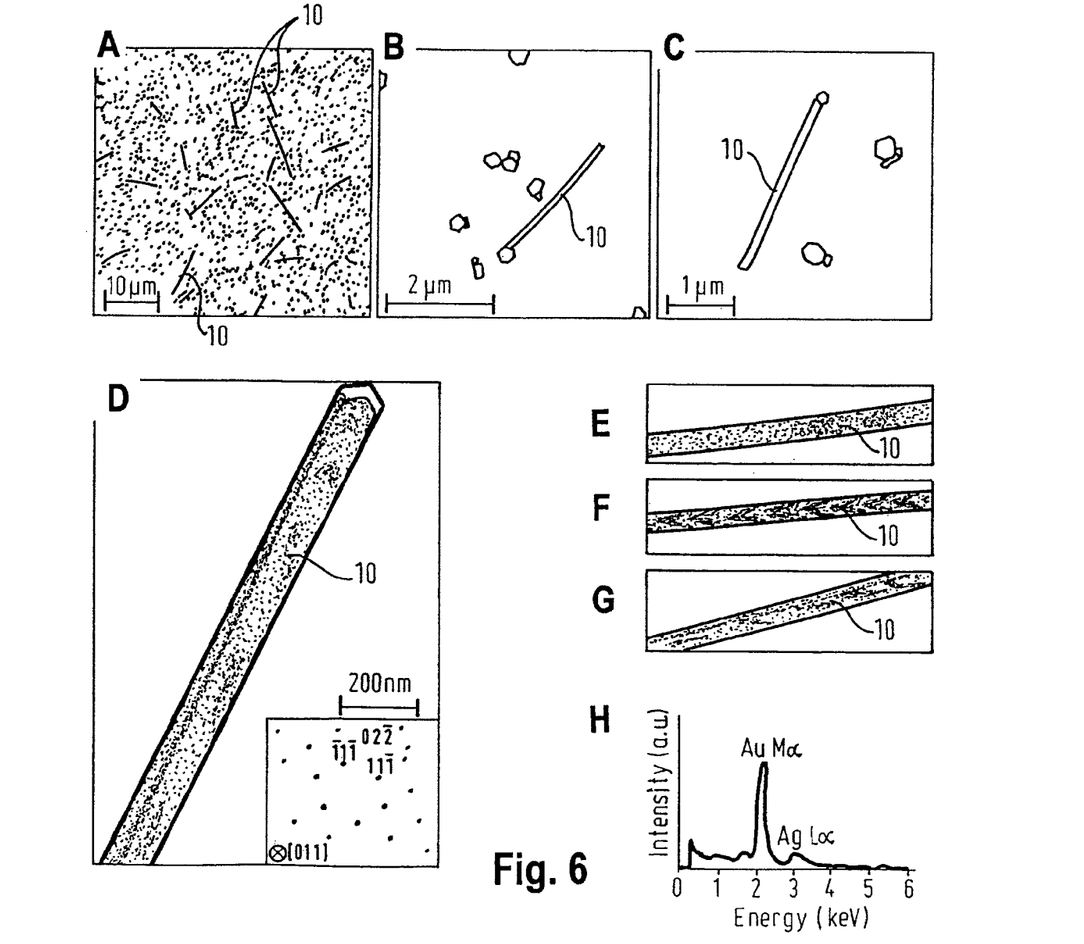

FIG. 6A to C show SEM micrographs of nanotubes 10 attached to carbon coated Si(100) substrate wafer 2. The images were taken at an angle of 72° to the surface normal. The nanowhiskers 6 have a length up to approximately 20 µm, and have a diameter of approximately 100 nm. The overall appearance of the core-shell structures seem therefore not to be changed, they are still attached to the surface. The Au film on the substrate and the whisker root (FIGS. 6B and 6C) shows pores at grain boundaries.

FIG. 6D shows a conventional TEM picture of an Au(Ag) nanotube 10 with a diameter of approximately 126 nm, the Au wall thickness is approximately 15 nm, no defects are visible in the structure. Moreover, Ag can now be detected as well in the polycrystalline Au film covering the substrate as well as in the remaining tubular structures on the surface (see FIG. 7D). In the Au layer and the nano-tube an EDXS intensity ratio of ~12 was recorded in a SEM.

The insert of FIG. 6D depicts a TEM micrograph of the tip of a nanowhisker after annealing. The contrast of the whisker changed, indicating a hollow, tubular structure. The projected outer diameter of the tube is 126 nm. The tip is closed; the dark contrast from the metallic side walls of the structure indicates a wall thickness of ~10 nm. The core of the tube shows a constant width indicating perfect nucleation and agglomeration of the diffusing vacancies. The inset in FIG. 6D shows the diffraction pattern taken by small area diffraction, corresponding to a [011]-zone axis. The nano-tube axis is parallel to the [01$\bar{1}$] crystal direction.

An EDXS analysis (FIG. 6H) gives the ration of the intensities Au Mα:Ag Lα as 14. The EDXS measurements from SEM and TEM are in agreement within the error limits of the measurements, verifying the Ag loss in the core of the tube. From a high resolution TEM (HRTEM) micrograph it was seen that the zone axis is along the [011] direction. Triangular contrast structures are observed in the micrograph. The wall thickness is 8.5 nm for this particular nano-tube. The growth direction is parallel to the [01$\bar{1}$] crystallographic direction. Tilting experiments in the TEM revealed that the cross section of the whisker is of the same hexagonal shape as the initial Ag nano-whiskers. The confining facets are of {100} and {111} type. In [011] zone axis the Au(Ag) sidewall formed on the ($\bar{1}$00) and (100) facets are therefore parallel to the electron beam and edge on showing the true Au(Ag) wall thickness. The shell is single crystalline, and defect free except for occasional stacking faults on {111} planes arising from the nucleation and subsequent coalescence of the epitaxial Au nuclei on the whisker surface facets. The formation of stacking faults due to coalescence was already observed in epitaxial Au layers (M. H. Jacobs, D. W. Pashley, M. J. Stowell, *Phil. Mag* 13, 129-156 (1966)) on Ag. No stacking faults were observed to connect the inner and outer surface of the shell surfaces.

Starting from the microstructure and composition investigations, the Ag depletion mechanism and the tube formation can be discussed: There are two possibilities to achieve a lower Ag content in the nano-tube than in the starting core-shell nano-whisker. One is the evaporation of Ag from the specimen at 150° C. in air. It is known that the melting temperature of metal particles decreases with decreasing diameter accompanied by an increasing vapor pressure of the material (e.g. M. Wautelet, *J. Phys. D: Appl. Phys.* 24, 343-346 (1991) and W. H. Luo, W. Y. Hu, S. F. Xiao, *J. Phys. Chem. C* 112, 2359-2369 (2008)).

For Ag evaporation, this would require that first Ag atoms diffuse through the Au layer and then secondly desorb from the surface facets. As was seen from the HRTEM micrographs, the Au shell grew single crystalline and expitaxial on the Ag nano-whiskers. The stacking faults cannot act as fast diffusion paths for Ag diffusion since they do not connect the inner and outer wall surface, therefore only Ag diffusion into Au single crystals should be considered here.

Diffusion of Ag into Au was already the topic of detailed studies in the past and is well documented (H. Mehrer, Ed., *Landolt-Börnstein New Series, Group III: Crystal and Solid State Physics, Volume 26, Diffusion in Solid Metals and Alloys* (Springer-Verlag Berlin 1990)). Using the experimental parameters (T=150° C., t=70 h), the bulk diffusivity of Ag through single crystalline Au is D=$2.7 \cdot 10^{-25}$ m²/s resulting in a diffusion length of L~Å. This distance in the order of the dimension of one Au unit cell and is too short to make diffusion and subsequent evaporation from the Au surfaces likely. Also the 8.5 nm wall thickness determined by HRTEM is unchanged from the as-deposited Au layer thickness on the Ag nano-whisker, indicating that the principle mass flow of Ag is—surprisingly—not radial to the whisker axis. The second mechanism for Ag depletion in the core does take into account the microstructure of the Au film of the substrate.

The only presumption is, that grain boundaries of the polycrystalline Au film protrude directly to the Ag nano-whisker root creating a diffusion path for Ag into the Au grain boundaries. The diffusivity of Ag along Au grain boundaries at 150° C. and 70 h is calculated as $D_{gb}$=$7.6 \cdot 10^{-15}$ m²/s leading to a diffusion length of $L_{gb}$~µm. The radius of the area around the nano-tube root where pores are detected is in the µm-regime and fits reasonably well to the calculated diffusion length. The pores at the root are probably also a result of diffusion processes like the Kirkendall effect caused by the Ag diffusion away from the core-shell whisker or are due to dewetting (J. J. Rha, J. K. Park, *J. Appl. Phys* 82, 1608-1616 (1997)) of the Au. Since there is clear evidence from the EDXS measurements that Ag accumulates in the Au film after annealing the Ag diffusion is confirmed.

FIG. 6E to G show TEM micrographs of a single nanotube 10 for a goniometer angle of −37°, +10° and +53° respectively. FIG. 6H shows an EDX spectrum of a nanotube 10. The intensity ratios for the Au Mα and the Ag Lα lines are approximately 12 indicating a depletion of Ag.

Figure 7:
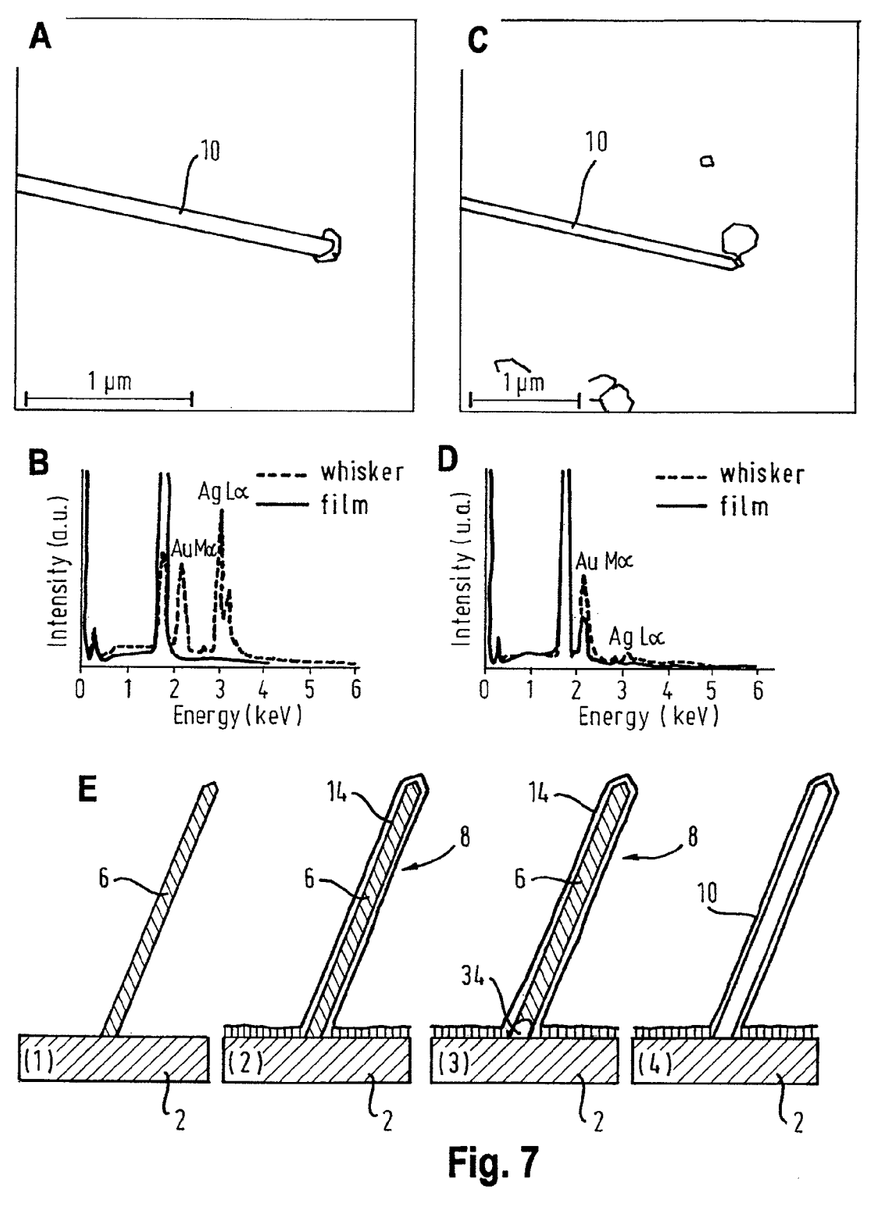

FIGS. 7A and C show respective SEM images of the grown and annealed gold film microstructure near the root of an Au-core/Ag-shell coated nanowhisker 8. The Au grain structure is resolved, as well as Kirkendall pores for the annealed surface indicating the occurrence of diffusion. The Au forms a polycrystalline film with ~50-100 nm diameter grains on the substrate.

FIG. 7B shows an EDX spectra from the grown nanowhisker 6 having an Au film coating 14. The Au Mα and the Ag Lα intensity ratio is approximately 0.4 for the nanowhisker 6. Moreover, Ag is not detectable in the Au film 14.

FIG. 7D shows an EDX spectra of a nanotube 10 and a Au film for the heat treated specimen. Ag is depleted in the former core-/shell structure 8, and is detectable in the Au layer.

FIG. 7E(1 to 4) show schematics of nanotube formation, in which 7E(1) shows a growth of an Ag nanowhisker 6 on a substrate wafer 2, 7E(2) shows the epitaxial Au coating of whisker 6 forming a polycrystalline Au layer 14 on the Si substrate wafer 2. FIG. 7E(3) shows Ag diffusion 34 into grain boundaries of the Au film 14. FIG. 7E(4) shows the Ag depletion of the nanotube 10 by surface diffusion on the inner surface of the wall.

From the shown experimental results and the estimated Ag diffusivities for different diffusion paths a formation model can be proposed. It is schematically drawn in FIG. 7E(1) The starting structure is an arrangement of single crystalline, defect free Ag nano-whiskers attached to a Si-substrate. For convenience only one nano-whisker is drawn.

FIG. 7E(2) The analysis shows that, the Au layer deposited at room temperature form a polycrystalline film on the substrate, but on the nanowhisker an epitaxial, single crystalline and defect free film.

FIG. 7E(3) It can be assumed, that due to the annealing grain boundary diffusion is activated and Ag atoms diffuse from the root of the Ag nanowhisker into the grain boundaries of the polycrystalline Au film. This is supported, in that the following hierarchy between bulk (D), dislocation ($D_d$), grain boundary ($D_{gb}$) and surface ($D_s$) diffusivity has been often found, and confirmed especially for Au—Ag: $D<<D_d \leqq D_{gb} \leqq D_s$ (H. Mehrer, Diffusion in Solids (Springer-Verlag Berlin Heidelberg, 2007), pp. 547-552). Also the estimated diffusion length for the used temperature and annealing time back this argument.

FIG. 7E(4) To deplete Ag from the core completely, surface diffusion has to be activated since the diffusion radially into the single crystalline Au shell is slow. Therefore, Ag atoms diffuse along the inner wall surface of the tube to the root and are also incorporated in the grain boundaries of the polycrystalline Au layer. At the same time a small part of the Ag might diffuses radially into the single crystalline Au shell. To match the intensity ratios from EDXS a ~2 nm thick coating of Ag could remain on the inner wall of the Au.

This might be due to an Ag coating on the inner shell surface which might be stable due to energetic reasons. The surface energies of Ag and Au are within the error margin the same. Theoretical calculations are inconclusive (A. M. Rodriguez, G. Bozzolo, J. Ferrante, *Surf. Sci.* 289, 100-126 (1993)) some experimental studies (W. R. Tyson, W. A. Miller, *Surf. Sci.* 62, 267-276 (1977)) even suggest that the surface energies of Ag are lower then those of Au. Another reason for the presence of Ag in the tube might be the formation of an ordered phase at the epitaxial Au/Ag interface which does not decompose at these low temperatures and was already postulated from experimental observations (F.-L. Yang, A. L. Greer, R. E. Somekh, *Thin Solid Films* 275, 258-261 (1996)).

The proposed model for the tube formation bears similarities to the lost wax processes known for millennia for casting metals. First a geometrical model is made out of wax and covered with a mold material. By using a temperature treatment the wax is melted and removed from the mold enabling that the mold to be used for the fabrication of structures with similar shape as the starting model by filling it with the cast material. In the here published fabrication route perfect high aspect ratio crystals are used as the "wax".

The mold is an epitaxial, single crystalline metal layer which covers the wax pattern. In contrast to the macroscopic molding process, the wax cannot just be removed from the mold by liquefying it. Instead the microstructure of the mold material has to be tailored to allow for the removal, secondly the heat treatment has to be carefully balanced to enable for grain boundary diffusion and also surface diffusion of the wax but not of the mold. This leads to depletion of the wax and a stable mold. Too high a temperature would collapse the mold by surface diffusion on the inner mold wall; at lower temperatures the diffusion processes would not be activated. The fabrication route can be generalized to other metal and material combinations; the only requirement is that the core/wax material can diffuse fast into e.g. grain boundaries of the shell/mold material deposited on the substrate. Possible prospect materials to grow nano-tubes attached on a surface would be Pd—Ag, Cu—Ni or Mo—V as well as many metal/ceramic (e.g. $Al_2O_3$) materials combinations. A new class of nanostructures can be processed with this route; these could play an important role in future technology.

Figure 8:
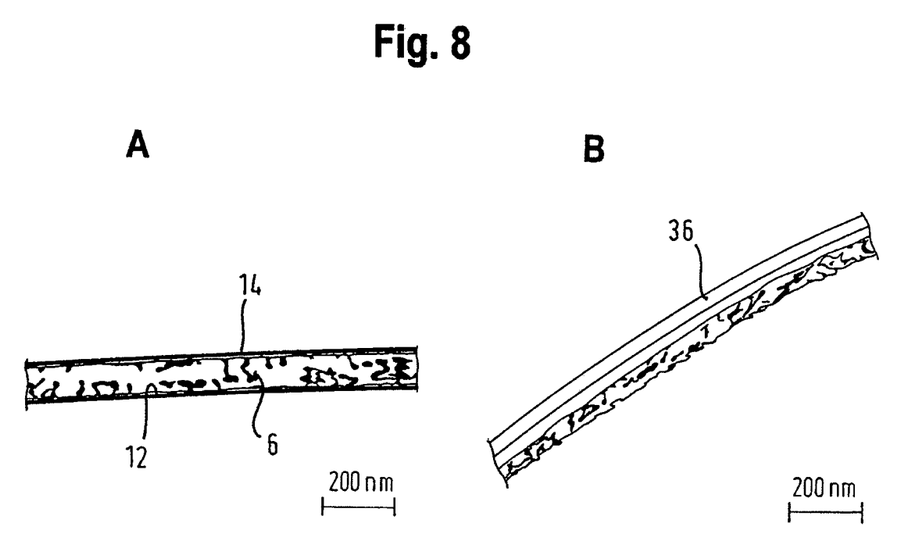

FIG. 8 shows a conventional TEM micrograph for the heat treated Ag (first metal 12) nanowhisker 6 only partially covered during Au deposition (second metal 14). FIG. 8A shows a tilting of the goniometer of +10°. The Au sidewall contrast is observed as in a nanotube 10. Wormlike contrast features are attached to the sidewall.

FIG. 8B shows the heat treated structure of FIG. 8A after tilting the goniometer to +60°, revealing a half pipe 36 geometry of the nanostructure.

EXAMPLE 7

Use of a Non-Metallic Nanowhisker

Figure 9:
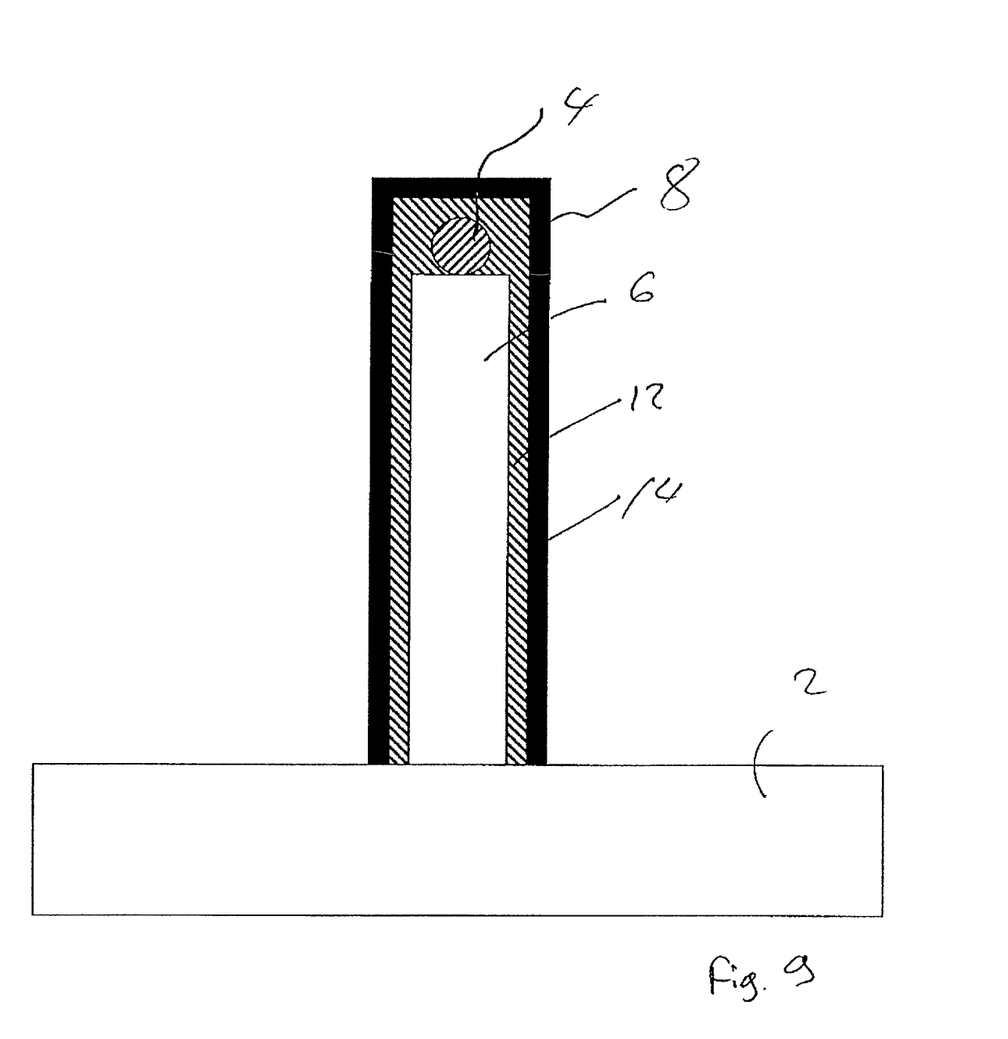

FIG. 9 shows an example of a non-metallic nanowhisker 6, which has been coated with a first metal 12 and a second metal 14 to form a coated nanowhisker 8 on a substrate 2. The growth mechanism chosen in this case is a VLS grown Si nanowhisker 6. The gold cap 4 was initially formed on the substrate wafer 2 as a growth promoter 4. As the Si nanowhisker 6 is formed at the site of the gold cap 4, the nanowhisker 6 "pushes" the gold cap 4 in the direction of its growth. The Si nanowhisker 6 and the gold cap 4 were subsequently coated with an Ag first metal layer 12 and then coated with an Au second metal layer 14 using a PVD technique in a vacuum system 16 (see FIG. 10), to form a coated nanowhisker 8. The formed coated nanowhisker was subsequently heat treated for 70 hours at approximately 150° C. to form a Au nanotube 10 by depletion of the Ag first metal 12, thereby forming a nanotube 10 having a non-metallic core. By altering the growth promoter 4 and/or the growth mechanism, also ZnO, carbon, or similar non-metallic nanowhiskers 6 can be grown to form the non-metallic core of the metallic nanotube 10.

As is shown in FIG. 8, the gold cap 4 of FIG. 9 does not necessarily have to be coated with either a first metal 12 or a second metal 14. One would thus obtain a non-metallic nanowhisker 6 having a metallic nanotube 10 surrounding it and a gold cap 4 contact at one of its ends, so that after separating the nanostructure from the substrate only the remaining free end of the nanostructure has to be provided with a metallic contact in order to produce a nanotransistor.

FIG. 10 shows a typical vacuum chamber 16, used for the synthesis of nanotubes 10. In the embodiment shown in FIG. 10, the vacuum chamber 16 includes a deposition source 18 arranged in the chamber 16, opposite the deposition source is a substrate holder 20, having a substrate 2 provided on the substrate holder 20 and an evaporation source 40. The vacuum chamber further includes a vacuum system 22, which is provided to create an ultrahigh vacuum (i.e. to reduce the pressure of the chamber 16 to less than $10^{-8}$ mbar), an access interface 24, a heater unit 28 and a control system 26. The control system 26 can be adapted to control the deposition source 18, the heater unit 28, the access interface 24, the vacuum system 22, the substrate holder 20, the evaporation source 40, and can include connections to temperature gauges, pressure gauges, a computer system, suitable detectors for detecting the nanostructures grown on the substrate 2 etc.

The access interface, can be a chamber door, a load lock system, or any other type of vacuum chamber access interface 24 which is commonly used to access the interior of a vacuum chamber.

The heater unit 28 is adapted to control the temperature of the vacuum chamber 16. The deposition source 18 can be chosen from the group of deposition devices including, a CVD deposition source 18, a PVD deposition source 18, a PECVD deposition source 18 and combinations thereof. Moreover, the deposition source 18 can be adapted to rotate about the substrate holder 20 or, the substrate holder 20 can be adapted to be rotated about the beam emanating from the deposition source 18. Furthermore, the angle between the substrate holder 20 and the deposition source 18 can be varied to facilitate the uniform coating and/or growth of the nanowhiskers 6, respectively. In some cases the substrate wafer 2 may need to be cooled during the deposition of a first metal 12 and/or a second metal 14 and/or a growth promoter 4, for this reason a cooling system 30 (not shown) could be provided at the substrate holder 20.

The nanowhisker 6 consisting of a first metal 12 or having a coating of a first metal 12 is grown and/or coated in the vacuum chamber 16 using a suitable deposition process. The nanowhisker 6 is also coated with a second metal 14 using a suitable deposition process in the vacuum chamber 16. The deposition parameters of the deposition source 18 used to deposit the first metal 12 and/or the second metal 14 and/or the growth promoter 4 are selected for the type of element or compound used in accordance with deposition steps which are routinely carried out by a person of ordinary skill in the art working with deposition sources 18.

If a nanowhisker 6 is grown using, for example, a VLS growth mechanism, outside of the vacuum chamber 16, then the nanowhisker 6 and the substrate wafer 2 can be placed into the vacuum chamber 16 onto the substrate holder 20 via the access interface 24, to be subsequently coated with a first metal 12 and a second metal 14.

The step of heat treating the coated nanowhisker 8 is advantageously carried out in the suitably adapted vacuum chamber 16 by use of the heater unit 28, but could equally also be carried out in a different type of process chamber 32 (not shown) if required.

EXAMPLE 8

Pd Nanotube Production

An example of nanotube 10 growth is the growth of Pd nanotubes 10, for this, Ag nanowhiskers 6 were grown via a carbon mediated physical vapour deposition technique as in Example 3 above. After growth of the nanowhisker Pd deposition was carried out in an ultra-high vacuum (UHV) molecular beam epitaxy (MBE) system with the pressure never exceeding $2 \cdot 10^{-10}$ mbar. The subsequent heat treatment was carried out in Air at ~145° C. for ~25 h.

EXAMPLE 9

Ni Nanotube Production

A Cu Nanowhisker 6 can be Grown in Accordance with Example 1 and Subsequently coated with a Ni coating to form Cu-core/Ni-shell coated nanowhiskers 8. The subsequent heat treatment was carried out in Air at ~225° C. for ~115 h.

Other types of nanowhisker and/or nanotube growth examples could be, Cu-core/Zn-shell or SnPb-core/Cu-shell nanostructures.

The invention claimed is:

1. A method for the synthesis of at least one metallic nanotube, the method comprising the steps of,
    applying a growth promoter to the substrate, the growth promoter being adapted to facilitate the growth of at least one nanowhisker consisting of or having a coating of a first metal,
    growing at least one nanowhisker on a substrate, the nanowhisker consisting of or having a coating of a first metal;
    coating said first metal with a second metal to form a coated nanowhisker; and
    heat treating the at least one coated nanowhisker, to produce a metallic nanotube,
    wherein said growth promoter is a growth layer and said growth layer is achieved by depositing a 1 to 40 nm thick carbon layer on said substrate wafer by one of the following processes, PVD, CVD, and PECVD.

2. A method in accordance with claim 1, wherein said step of heat treating is carried out at a temperature range of approximately 145° C. to 155° C. for approximately 65 to 75 hours for a structure comprising an Ag core and an Au shell or, in the range of approximately 140° C. to 150° C. for approximately 20 to 30 hours for Ag-core/Pd-shell coated nanowhiskers or, approximately 200° C. to 250° C. for approximately 100 to 130 hours for Cu-core/Ni-shell coated nanowhiskers.

* * * * *